United States Patent [19]  [11] 3,959,786
Chana et al. [45] May 25, 1976

[54] ISOLATED TWO-WIRE TRANSMITTER

[75] Inventors: Maghar S. Chana; Eric A. Hauptmann, both of Rochester, N.Y.

[73] Assignee: Rochester Instrument Systems, Inc., Rochester, N.Y.

[22] Filed: June 3, 1975

[21] Appl. No.: 583,479

[52] U.S. Cl. ................................. 340/210; 321/2; 340/186
[51] Int. Cl.² ..................................... G08C 19/02
[58] Field of Search ................. 321/2, 18; 340/186, 340/210; 330/10; 323/1

[56] References Cited
UNITED STATES PATENTS

| | | | |
|---|---|---|---|
| 3,387,266 | 6/1968 | Swartwout et al. | 340/210 |
| 3,560,948 | 2/1971 | Inose et al. | 340/210 X |
| 3,757,195 | 9/1973 | Sklarouf | 321/2 |
| R27,596 | 3/1973 | Hurd | 340/210 |

OTHER PUBLICATIONS

IBM Tech. Disc. Bulletin, Vol. 13, No. 8, Jan. 1971, pp. 2255–2256, "Remotely Powered Measurement Systems," By E. R. Barr.

*Primary Examiner*—Gerald Goldberg
*Attorney, Agent, or Firm*—Eliot S. Gerber

[57] ABSTRACT

An isolated two-wire transmitter includes a regulated d.c. power supply having an astable multivibrator which generates isolated power supplies and input terminals which are connected to a first operational amplifier to thereby control a transistor in order to produce a current proportional to the input voltage. That proportional current controls the output of a current transformer, which chops that current at a rate determined by the multivibrator. The a.c. current from the current transformer is rectified and controls a second operational amplifier and a Darlington circuit to thereby produce an isolated current proportional to the input voltage.

14 Claims, 2 Drawing Figures

3,959,786

ISOLATED TWO-WIRE TRANSMITTER

BACKGROUND OF THE INVENTION

The present invention relates to an electronic converter for communication of analog information by wire and more particularly to an isolated two-wire transmitter.

At the present time a process plant, such as an oil refinery, includes a large number of separate devices or sensing points which are monitored from one or more central locations. For example, a central control room may monitor hundreds of sensing points each of which varies in some way. Each of the monitored devices or sensing points may have one or more transducers, such as temperature sensitive thermocouples, attached to them to convert the monitored effect, such as a temperature change, into an analog electrical signal. Those electrical signals often have too low a signal-to-noise ratio to be sent, over wires, directly to the central location. Consequently, the sensor (transducer) is connected by wires to a "two-wire transmitter" which is preferably located close to the transducer.

The two-wire transmitter receives the analog signals from the sensor, amplifies and isolates those signals to within a predetermined range of current, and sends the isolated current over wires to the receiving instrument in the control location. For example, the receiving instrument may be a controller, a warning annunciator, a recorder, or a meter, etc. The two-wire transmitter is powered by power from a direct current source connected to the same wires over which the transmitter sends its information to the central location.

There are a number of such two-wire transmitters (converters) presently available. In some cases they do not provide the requisite degree of isolation, for example, 100 volts isolation or less, and accuracy in that their output current is not accurate and truly linear of the input signal. In some isolated two-wire converters, although their initial accuracy may be satisfactory, they may become inaccurate due to environmental temperature variations, aging or other causes. In addition, in some cases there are limitations of space so that the relatively large size of some transmitters may present an installation problem. The cost of such transmitters may also be important since a single large process plant may utilize hundreds of such transmitters.

One type of isolated transmitter is proposed in U.S. Pat. No. 3,757,195 to Sklaroof. A different isolated transmitter is proposed in U.S. Pat. No. 3,483,476 to T. Kobayashi et al, in which the low-level input signal is chopped, which involves a relatively costly circuit. In Kobayashi a.c. signal is amplified and applied directly to an isolator transformer as a voltage signal using a two-tap primary and without current routing.

BRIEF SUMMARY OF THE INVENTION

In accordance with the present invention an isolated two-wire transmitter (converter) is provided which is sufficiently simple in its circuitry so that its circuit may be constructed on a single small printed circuit board.

The circuit of the transmitter includes two input terminals which are removably wired to the sensor and receive the voltage input signal. The transmitter's two output terminals are wired to a d.c. source and the output current signal is taken from those two terminals. The transmitter includes its own d.c. regulated power supply and its own source of evenly timed square wave waveforms. For that purpose the regulated power supply and square wave source preferably utilize a d.c.-d.c. chopper, which is a free-running astable multivibrator, a voltage transformer and a diode network having six diodes. The diode network provides regulated positive and negative d.c. voltage at a predetermined level and also pulsating negative and positive square waves at a predetermined rate for current routing.

The transmitter input terminals are connected to a resistor network which includes replaceable resistors and a variable resistor in order to determine the zero setting at the input terminals. A Zener diode connected in the input stage provides a reference voltage. The input voltage is amplified by an operational amplifier and converted to a current proportional to the input voltage using a single transistor. The proportional current is fed to the center tap of the primary winding of a current transformer, the end taps of that winding being connected to the negative and positive square wave source through routing diodes.

The alternating current from the secondary winding of the current transformer is rectified to produce an isolated voltage proportional, i.e., directly linear, with the current from the transistor. That rectified voltage is consequently also proportional to the input voltage from the transducer. The rectified voltage, by means of an operational amplifier and a Darlington amplification circuit, is changed to a current which is proportional to that voltage, and consequently also proportional to the input voltage from the sensor. It is that proportional current which is driven through the transmitter output terminals and provides its current signal.

OBJECTIVES AND FEATURES OF THE INVENTION

It is an objective of the present invention to provide an isolated two-wire transmitter having a relatively high degree of isolation, for example, 600 volts d.c., so that either side may be grounded or both sides grounded or neither side grounded.

It is an objective of the present invention to provide such a two-wire transmitter which will have linear accuracy in the sense that its output current, over its predetermined range, is a linear accurate direct representation of the input voltage signal and such linearity will be within ±0.1% of its span (output range).

It is a further objective of the present invention to provide such a transmitter which will be reliable in operation and be accurate despite being in an adverse environment and have a change in output of less than ±0.003% per degree Fahrenheit of temperature change.

It is a further objective of the present invention to provide such a two-wire transmitter which will be relatively small in size and relatively low in cost.

It is a further objective of the present invention to provide such a transmitter whose accuracy will not be adversely affected by changes in its power supply so that a 10-volt change in such supply will have an effect on its output current of less than ±0.025%.

It is a further objective of the present invention to provide such a two-wire transmitter which will have an output current whose range is readily changeable so that it may be adjusted to provide, for example, either a range of 4 to 20 milliamps or 10 to 50 milliamps.

It is a further objective of the present invention to provide such a two-wire transmitter whose input impedance will be relatively high with a minimum input impedance of one megohm so that the transmitter is compatible with various types of transducers connected to its input terminals.

It is a further objective of the present invention to provide such a two-wire transmitter which will accommodate a broad range of power supply, for example, power supplies providing from 10 to 60 volts direct current, thereby enabling the transmitter to be used with a greater number of instruments.

It is a feature of the present invention to provide a two-wire transmitter having two input terminals which normally would be connected to a voltage signal or resistance source, such as a thermocouple or other transducer, and two output terminals which would be normally connected to a d.c. power source. The transmitter comprises regulated power means which is connected to the output terminal to provide a source of isolated and regulated d.c. power at a predetermined voltage and a square wave source coupled to the regulated power means to provide a source of substantially equally timed electrical square wave pulses. The transmitter also includes a first amplifier means, such as an operational amplifier and a transistor, having input and output terminals whose input terminals are connected to the transmitter input terminals. A current transformer of the isolated transmitter has a primary and a secondary winding and its primary winding has three taps, its center tap being connected to the output of the first amplifier means and its other taps being connected to the square wave means. An a.c. to d.c. network is connected to the secondary winding of the current transformer and to a second amplifier means having input and output terminals, the input terminal being connected in series with a transmitter output terminal.

It is a further feature of the present invention that the regulated power means includes an astable free-running multivibrator connected in the output stage, a voltage transformer having a primary and a secondary winding, whose primary winding is connected to said multivibrator, and an a.c. to d.c. network connected to the secondary winding of said voltage transformer to provide negative and positive power supplies at a predetermined level.

It is a still further feature of the present invention to provide such a transmitter which includes a voltage limiting device connected in the transmitter output stage and a current limiting device connected effectively across the second amplifier output terminals. Preferably the second amplifier means includes a Darlington circuit, the voltage limiting device is a Zener diode and the first and the second amplifier each includes an operational amplifier.

BRIEF DESCRIPTION OF THE DRAWINGS

Other objectives of the present invention will be apparent from the following detailed description of the inventors' best mode of practicing the invention, which description should be taken in conjunction with the accompanying drawings.

In the drawings.

DETAILED DESCRIPTION OF THE INVENTION

Figure 1:
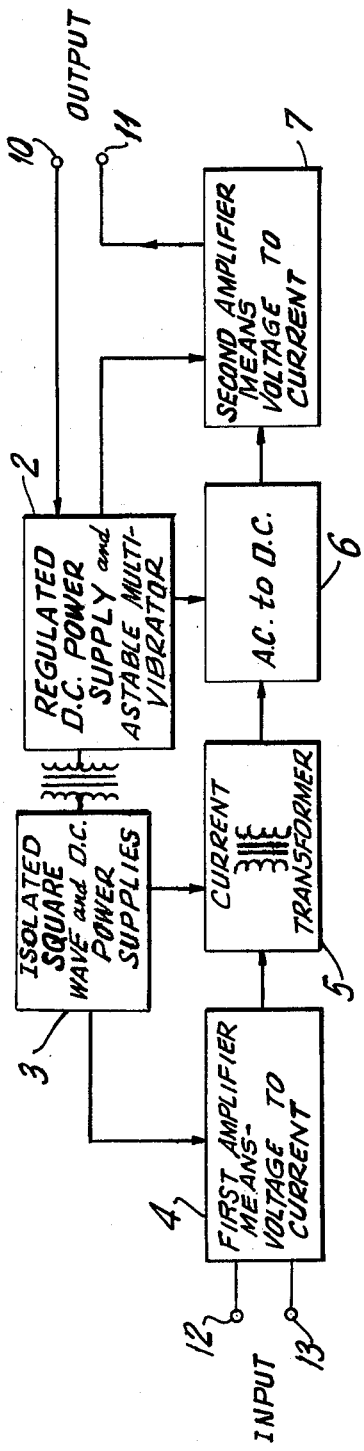
FIG. 1 is a block diagram illustrating the functional components of the circuitry of the two-wire transmitter of the present invention.

The output terminal 10 is the positive terminal and the output terminal 11 is the negative terminal and the terminals 10 and 11 are connected by wires to a suitable source of direct current power preferably being in the range of 10 to 60 volts d.c. The power may be obtained from a battery source or from a direct current power supply.

The output terminals 10,11 are connected to the internal regulated d.c. power supply and astable multivibrator 2 which provides power to the isolated square wave source 3 and the other portions of the circuit. The power supply drives an astable multivibrator which provides d.c. power, for example, at +4 volts and −4 volts and also provides a 50% duty cycle negative and positive pulses at the preferred rate of 3 K Hz. The input terminals 12,13 are removably connectable to the sensor (transducer), such as a thermocouple, and are connected to a first amplifier means 4. The first amplifier means 4 converts the voltage input to an amplified current proportional (directly linear) to that input voltage. The first amplifier means produces current which is connected to current transformer 5 whose chopper operation is controlled by the negative and positive pulses from isolated square wave source 3. The output of current transformer 5 is connected to a.c.-d.c. network 6 which in turn is connected to a second amplifier means 7, which amplifier means 7 converts the d.c. voltage from a.c.-d.c. network 6 to a current which is proportional to that voltage.

Figure 2:
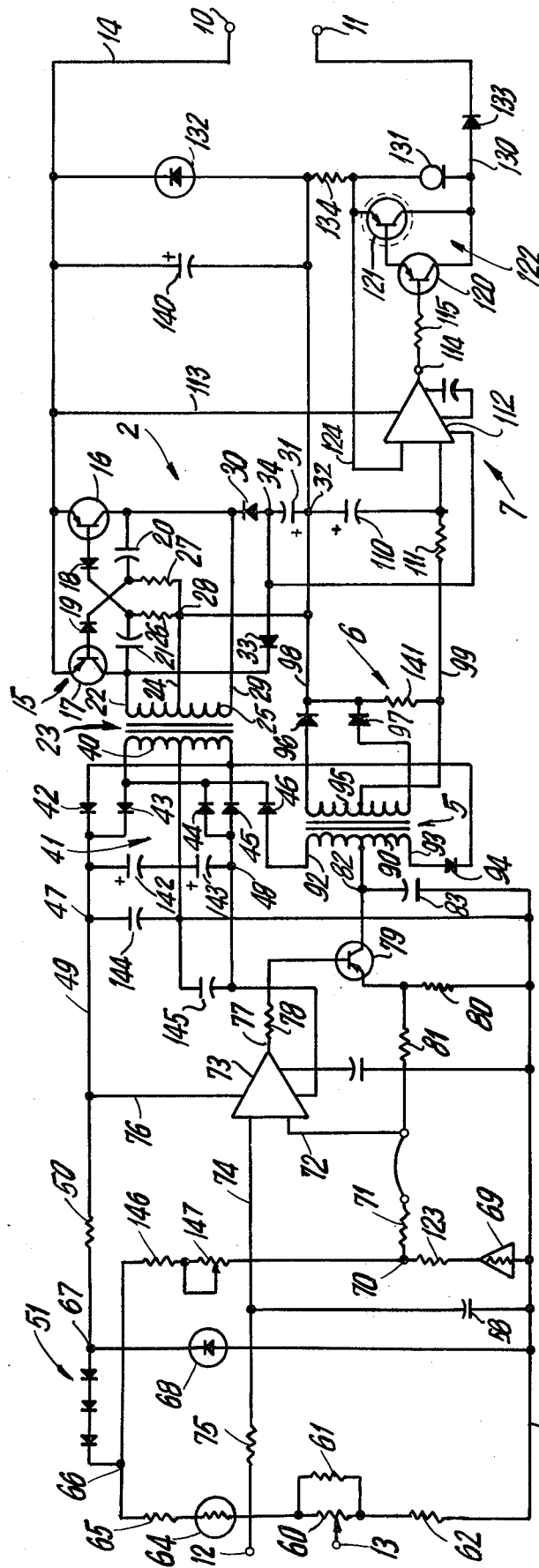
FIG. 2 is a schematic diagram of the circuitry of the two-wire transmitter of the present invention shown in FIG. 1.

The detailed circuitry of a preferred embodiment is shown in FIG. 2. It will be understood that the terms "wires" or "lines", as used herein, may refer to separate wires or, in the case of the printed circuit board, refers to thin elongated generally metal conductive areas which are plated, etched or otherwise formed on the printed circuit boards. As shown in FIG. 2, terminal 10 is connected to wire or line 14. The wire 14 is connected to a direct current — direct current chopper 15 which is preferably an astable free-running multivibrator having an approximately 50% duty cycle. The d.c.—d.c. chopper 15 is part of the regulated power supply 2 and provides the rate of the square wave source 3. The d.c.—d.c. chopper 15 includes a first PNP transistor 16 and a second PNP transistor 17 each of which has its emitters connected to the line 14. The respective bases of the transistors 16 and 17 are connected to the anodes of the respective diodes 18 and 19. The cathodes of the diodes 18 and 19 are connected to one side of the respective capacitors 20 and 21. The opposite sides of the respective capacitors 20 and 21 are connected to the collectors of the respective transistors 16 and 17.

The collector of transistor 17 is connected to the top end tap 22 of the primary winding 25 of the voltage transformer 23. A center tap 24 of the primary 25 is connected to one end terminal of the resistor 26 whose other end is connected to the cathode of diode 18 and to one side of the capacitor 21. Another resistor 27 is located between the point 28 and the cathode of diode 19 and is also connected to one terminal of the capacitor 20. The bottom end tap 29 of the primary winding 25 is connected to the collector of the transistor 16 and to the cathode of the diode 30. The anode of the diode 30 is connected to one side of the capacitor 31 whose opposite side is connected to the point 32, the point 32 being a positive voltage reference level. A diode 33 is connected between the point 34 (which point 34 is between the anode of diode 30 and the one side of the capacitor 31) and the top tap 22. The secondary winding 40 of the voltage transformer 23 is connected to an a.c.–d.c. network 41 which provides both positive direct current voltage and negative direct current voltage at predetermined voltage levels, for example, at plus 4 volts and negative 4 volts.

The a.c.–d.c. network 41, which also is part of the d.c. power supply 2 and provides the square wave source 3, consists of diodes 42, 43, 44, 45 and 46. The anodes of diodes 42 and 43 are connected respectively to the bottom end tap and the top end tap of the secondary winding 40 of voltage transformer 23. The cathodes of the diodes 44 and 45 are connected respectively to the top and bottom end taps of the secondary winding 40. The cathode of diode 46 is also connected to the top end tap of the secondary winding 40. The diodes 42 and 43 present a regulated predetermined positive constant voltage at the point 47, for example, of positive 4 volts d.c. Similarly, the diodes 44 and 45 present, at the point 48, a regulated constant direct current predetermined voltage, for example, of negative 4 volts d.c. Point 47 is connected by means of line 49 through resistor 50 to the series of three diodes 51 which series of three diodes provides a predetermined voltage drop to point 66.

The input terminals 12 and 13 would normally be connected to a transducer producing an input voltage signal; for example, the transducer may be a thermocouple, a resistance temperature detector or slide wire resistance elements. Generally the input voltage signal would be in the millivolt range. The input terminal 13, which is the positive input terminal, is connected to the movable arm of variable resistor (potentiometer) 60, for example, of 100 ohms. In addition, a parallel resistor 61 may be placed across the end terminals of the variable resistor 60. The variable resistor 60 is utilized to set a zero offset. In addition, a resistor 62, in series with the variable resistor 60, is selected to provide a zero offset in accordance with the desired input span (input voltage range). Resistor 62 is connected to line 63 which provides a common line to which various of the components are connected. A temperature compensating resistor 64 is connected at the opposite end of the variable resistor 60. The resistor 64 provides a compensation for the low-end nonlinearity of the output of thermocouples. Resistor 64 is connected, through resistor 65, to point 66.

A reference voltage means, for example, a Zener diode 68, is connected from the line 63 to the point 67. The reference Zener diode, for example, of 3 volts, provides a stable reference voltage to excite the input signal conditioning bridge through the string of diodes 51 (that bridge consisting of resistors 69, 123, 147, 146 and 65, 64, 61, 60 and 62). A second temperature sensitive resistor 69 is connected between line 63 and point 70, which temperature sensitive resistor 69 compensates for temperature changes which occur at the input terminal 13 in case of thermocouple inputs. The point 70 is connected through resistor 71 to the input terminal 72 of the amplifier 73 (part of the "first amplifier means"). Preferably amplifier 73 is a solid-state single-chip operational amplifier. The other input terminal 74 of amplifier 73 is connected through resistor 75 to the negative input terminal 12 which is also connected to filter capacitor 58.

The power for the operational amplifier 73 is obtained through line 76 from line 49. The output terminal 77 of amplifier 73 is connected through resistor 78 to the base of transistor 79 (part of the "first amplifier means"). The emitter of PNP transistor 79 is connected through resistor 80 to the line 63 and is also connected through resistor 81 to the amplifier input terminal 72. The collector of transistor 79 is connected to point 82 and to filter capacitor 83. Point 82 is connected to the center tap of the primary winding 90 of the current transformer 5.

The transistor 79 provides a current at point 82 which is proportional to the input signal received across terminals 12 and 13. That proportional current is chopped by the current transformer 5 which is preferably a 1-to-1 ratio current transformer. The primary 90 of the transformer 5 is controlled and powered from the a.c.–d.c. network 41, i.e., the "square wave source". For that purpose its top tap 92 is connected to the anode of diode 46 and its bottom tap 93 is connected to the anode of diode 94 which diode 94 has its cathode connected to the bottom tap of secondary winding 40.

The output of the transformer 5, at its secondary winding 95, produces an a.c. current which is converted to direct current by means of the "second a.c.–d.c. network" which includes the diode 96 connected to its top tap and diode 97 connected to its bottom tap. The d.c. voltage thereby produced across the lines 98 and 99 is proportional to the current produced on the secondary winding 95 and preferably is on a 200-millivolt full scale.

The lines 98 and 99 are connected to a resistor-capacitor filter comprising a capacitor 110 and a resistor 111. The resistor 111 is connected to the negative input of the amplifier 112 (part of the "second amplifier means"). Preferably the amplifier 112 is also a single-chip solid-state operational amplifier. The amplifier 112 is powered by means of line 113 connected to the line 14 and the output 114 of amplifier 112 is connected through resistor 115 to an amplifier circuit 122 (also part of the second amplifier means), which preferably is a Darlington circuit consisting of transistors 120 and 121. Specifically the resistor 115 is connected to the base of the transistor 120. The emitter of transistor 121 is connected to a feedback line 124, which is connected to the positive input of the amplifier 112. The collector of transistor 121 is connected to line 130 to which line 130 a current limiting device 131 and a voltage reversal protection device diode 133 are connected. The current limiting device is a current limiting diode 131 and the voltage reversal device is the diode 133. The Zener diode 132 may have a predetermined breakdown voltage of 8 volts and the current limiting diode 131 may have a predetermined amperage of below 4 milliamps, for example, 3.3 milliamps. A temperature stable resistor 134 is connected between the current limiting diode 131 and the Zener diode 132 and acts as a feedback circuit.

In operation, the output terminals 10 and 11 are connected to a source of d.c. power, for example, a battery or d.c. power supply. This d.c. power supply sets up a d.c. current through the Zener diode 132 to generate a regulated 8 volts power supply. The minimum value of the said d.c. current is determined by the current limiter diode 131. The Zener diode 132 is connected in parallel with a filter capacitor 140 and is connected across the d.c.–d.c. chopper 15 which provides negative and positive going square wave pulses at a preferably 50% duty cycle to the primary 25 of the transformer 23. The output of transformer 23 is taken at its secondary winding 40 to an a.c.–d.c. network consisting of a set of diodes. These diodes provide an isolated and regulated power supply of predetermined voltage which is the internal power supply of the transmitter.

The input voltage signal from the transducer connected to the transmitter is to the transmitter input terminals 12 and 13. That input voltage signal through the positive terminal 13 is exactly and predeterminedly adjusted to accord with the desired zero setting by means of a variable resistor 60 and selected resistors 61, 62 and 123. Its zero setting is maintained by means of temperature compensating resistors 64 and 69. The signals from the input terminals are transmitted across the reference network to a first amplifier 73 which is powered from the a.c.–d.c. network 41. The first amplifier 73 controls a second amplifier 79 which is connected to the primary winding of a current transformer 5. The current transformer 5 receives a current from point 82 which is proportional to the input voltage signal, that is, it is in a direct linear relationship to the input signal. The current transformer 5 chops the incoming current from its secondary in accordance with the negative directed and positive directed wave forms received from the d.c.—d.c. chopper 15 through the transformers 23. That is, the rate of the chopping of the current by the current transformer 5 is determined by the rate of the d.c.—d.c. chopper. The current transformer's output, on its secondary winding, is converted to d.c. current by diodes 96,97 and those diodes provide a voltage which is proportional to the output current of the current transformer 5. Using a d.c.—d.c. chopper having a 50% duty cycle the current from point 82 will flow one-half of the time in the upper half of the primary winding 90 of the current transformer and one-half of the time in the lower half of the primary winding 90. Specifically, current flows in the loop for one-half of the time as follows: point 82, top half of primary winding 90, tap, 92, diode 46, secondary 40. Current flows in the loop for the other half of the time as follows: point 82, lower half of primary winding 90, tap 93, diode 94 and secondary 40.

The output current of the current transformer is directly proportional to its input current, the voltage taken across lines 98,99 is in direct linear proportion to the current at point 82 and consequently that voltage across lines 98,99 is in direct linear relationship to the input voltage across the transmitter input terminals 12,13. 13. The voltage on lines 98,99 is filtered, amplified and converted into a proportional output current. In the described embodiment the amplification and voltage-to-voltage conversion is by means of operational amplifier 112 which controls a Darlington circuit consisting of transistors 120 and 121. The output voltage across lines 98 and 99 is applied to the input of operational amplifier 112, which receives a negative feedback equal to the voltage generated across resistor 134 due to the total output current of the transmitter. Because all of the output current — including that of current limiter diode 131 — passes through resistor 134, an absolute control of the output current is made possible, thus eliminating the undesirable change of the output current due to temperature drift of the current limiter and change in d.c. power supply to the transmitter.

A specific, and not limiting, example of circuit values, shown in the circuit of FIG. 2, is as follows: Resistors 26,27,65 are 47K ohms; resistor 50 is 750 ohms; resistor 141 is 261 ohms; resistors 134, 115, 111, 78 are 10K ohms; resistor 81 is 301 K ohms; resistor 80 is 1 K ohms; resistor 146 is 6.8 K ohms; variable resistor 147 is 10 K ohms; capacitors 20,21 21 are 0.0033 $\mu$F; capacitor 31 is 1 $\mu$F; capacitors 140, 110, 142, 143 are 10 $\mu$F; and capacitors 144,145 are 0.01 $\mu$F.

Modifications may be made in the present invention within the scope of the sub-joined claims. For example, as shown in FIG. 2, provision may be made to compensate for various types of thermocouples to be connected to the transmitter input terminals by means of variable resistor 147.

What is claimed is:

1. An isolated two-wire transmitter having two input terminals to be connected to a voltage signal source and two output terminals to be connected to a d.c. power source, said transmitter comprising:

power means connected to said output terminals to provide a source of regulated d.c. power at a predetermined voltage, and pulse means connected to said power means to provide a source of substantially equally timed negative and positive electrical pulses;

a first amplifier means having input and output terminals whose input terminals are connected to said transmitter input terminals and which functions to provide a current output which is proportional to the voltage of said voltage signal source;

a current transformer having primary and secondary windings, whose primary winding has at least three taps, its center tap being connected in series with and controlled by the output of said first amplifier means and its other taps being connected to said pulse means;

an a.c. to d.c. network means connected to the secondary winding of said current transformer to provide a proportional voltage which is proportional to the said current output applied to said primary winding;

a second amplifier means having input and output terminals, said input terminal being connected to said a.c. to d.c. network means for its control, and its output terminal being connected in series with said transmitter output terminals to provide an output current to said transmitter which is proportional to said proportional voltage and is thereby proportional to the voltage of said voltage signal source.

2. A transmitter as in claim 1 wherein said second amplifier means includes an operational amplifier and a Darlington circuit.

3. A transmitter as in claim 1 and further including a voltage limiting device in the output stage of the said transmitter and a current limiting device effectively connected across said transmitter output terminals.

4. A transmitter as in claim 3 wherein said voltage limiting device is a Zener diode.

5. A transmitter as in claim 1 wherein each of said amplifier means includes an operational amplifier.

6. A transmitter as in claim 1 wherein said first amplifier means includes an operational amplifier and a transistor controlled by and connected to said operational amplifier and whose output is to said center tap of said primary winding of said current transformer.

7. An isolated two-wire transmitter having two input terminals to be connected to a signal source and two output terminals to be connected to a d.c. power source and an output stage connected to said output terminals, said transmitter comprising:
- an astable free-running multivibrator connected in the said output stage, a voltage transformer having a primary and a secondary winding, whose primary winding is connected to said multivibrator;
- a first a.c. to d.c. network connected to the secondary winding of said voltage transformer to provide negative and positive direct current at predetermined levels and pulsating negative and positive current at a predetermined rate;
- a first amplifier means having input and output terminals whose input terminals are connected to said transmitter input terminals and which provides a current output proportional to the voltage across the transmitter input terminals;
- a current transformer having primary and secondary windings, whose primary winding has at least three taps, its center tap being connected with the output of said first amplifier means and its other taps being connected to said a.c. to d.c. network for control by its pulsating negative and positive current;
- a second a.c. to d.c. network connected to secondary winding of said current transformer to provide a voltage proportional to the current received by said current transformer;
- a second amplifier means having input and output terminals, said input terminal being connected to said second a.c. to d.c. network for control, and its output terminal being connected to said transmitter output terminal.

8. A transmitter as in claim 7 wherein said second amplifier means includes an operational amplifier and a Darlington circuit.

9. A transmitter as in claim 7 and further including a voltage limiting device connected across said astable multivibrator and a current limiting device effectively connected across said second amplifier output terminals.

10. A transmitter as in claim 9 wherein said voltage limiting device is a Zener diode.

11. A transmitter as in claim 7 wherein said multivibrator is a d.c.—d.c. chopper operating at about 50% duty cycle.

12. A transmitter as in claim 7 wherein said first and second amplifier means each includes an operational amplifier.

13. A transmitter as in claim 12 and further including an amplifier as part of said first amplifier means which is controlled by and connected to said output of said operational amplifier and whose output is to said center tap of said primary winding of said current transformer.

14. A transmitter as in claim 7 and having means to present a feedback signal to said second amplifier means representing the total current across said output terminals, thereby avoiding output current changes due to changes in the power supply or temperature drift of the current limiting device.

* * * * *